United States Patent
Wang

(10) Patent No.: US 7,336,340 B2
(45) Date of Patent: Feb. 26, 2008

(54) METHOD OF EXPOSURE ERROR ADJUSTMENT IN PHOTOLITHOGRAPHY FOR MULTIPLE PRODUCTS

(75) Inventor: Peter Wang, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 213 days.

(21) Appl. No.: 10/777,417

(22) Filed: Feb. 11, 2004

(65) Prior Publication Data

US 2005/0122496 A1    Jun. 9, 2005

(30) Foreign Application Priority Data

Dec. 4, 2003    (TW) .............................. 92134256 A

(51) Int. Cl.
G03B 27/68    (2006.01)
G03B 27/52    (2006.01)
G03B 27/32    (2006.01)

(52) U.S. Cl. .............................. 355/52; 355/55; 355/77

(58) Field of Classification Search .................. 355/52, 355/53, 55, 77; 430/30, 311; 438/758
See application file for complete search history.

(56) References Cited

U.S. PATENT DOCUMENTS

| | | | |
|---|---|---|---|
| 6,535,774 B1 * | 3/2003 | Bode et al. ................. | 700/109 |
| 6,560,506 B2 * | 5/2003 | Toprac ...................... | 700/121 |
| 6,643,557 B1 * | 11/2003 | Miller et al. ................ | 700/110 |
| 6,780,552 B2 * | 8/2004 | Schedel et al. ............... | 430/30 |
| 6,825,912 B2 * | 11/2004 | Park ........................... | 355/27 |
| 6,873,399 B2 * | 3/2005 | Kuo ............................ | 355/52 |

* cited by examiner

*Primary Examiner*—Henry Hung Nguyen
(74) *Attorney, Agent, or Firm*—Pro-Techtor Int'l Services

(57) ABSTRACT

A method of adjusting exposure error for multiple products is described. First, one Photo Feed Back System (PFBS) suited to host-product or miscellaneous product is chosen. Different standard points and compensation difference for host-product or miscellaneous product are provided. Then, the PFBS parameter is calculated as an exposure adjustment value. The standard point and compensation difference for miscellaneous product are dependent on host-product.

17 Claims, 2 Drawing Sheets

METHOD OF EXPOSURE ERROR ADJUSTMENT IN PHOTOLITHOGRAPHY FOR MULTIPLE PRODUCTS

FIELD OF THE INVENTION

The present invention is a method of exposure error adjustment automatically in photolithography, and drawbacks in the PFBS used nowadays are improved to enhance accuracy of exposure and promote product operation.

The invention utilizes the PFBS parameter calculation formula to evaluate an adjusted value of exposure, the PFBS parameter calculation for minor secondary product is modified to link the primary or host product exposure, and the adjustment value calculation is thus modified for the real exposure condition. The reference database of minor secondary product for adjustment value calculation is designed to be related to the adjustment value of the host product, and therefore exposure for minor secondary products is modified depending on exposure variation of host product.

Embodiment

The host product defined as the primary product for which the manufacturing process, equipment, and software have been set-up and configured to produce, a multiple products manufacturing processes. Occasionally, various minor products are scheduled into operations. The various minor products are termed the secondary products, and amount of secondary product processed is much smaller than host product.

Because the small amount of secondary product processed compared to the amount of host product, the influence of the secondary product on whole product operation is limited, and therefore the host product is not noticeably affected by secondary product. Thus, the host product utilizes formula (1) for PFBS parameter calculation to evaluate the PFBS parameter as an exposure adjustment value directly. Referring to FIG. 2 a step 200 for choosing a suitable PFBS start value is performed first. Once a PFBS start value suited to the host product is chosen, formula (1) is used to calculate the PFBS parameter for the host product. Formula (1) is given as:

$$PPs_{host, N} = PPs_{host, N-1} - g*B*(PPm_{host,N-1} - \text{Target})$$ formula (1)

Where "$PPs_{host,N}$" in formula (1) is the PFBS parameter of the "N" lot host product exposed.

Following Step 200, Step 220 for providing a standard point data of host product is then performed, and Step 230 for providing a compensation difference data of host product is also performed. The standard point of host product is "$PPs_{host,N-1}$" in formula (1), and "$PPs_{host,N-1}$" is the PFBS parameter evaluated for the "N-1" lot host product exposed. That is, the "$PPs_{host,N-1}$" is the PFBS parameter evaluated of host product last processed.

The compensation difference of host product is the section after the minus sign "−" in formula (1), where "$PPm_{host, N-1}$" represents an actual measurement value of the "N-1" lot host product exposed, and the "Target" is an objective value predicted. The difference in value between "$PPm_{host,N-1}$" and "Target" represents an actual exposure error of host product last processed.

Further, "g" in formula (1) is a damping factor, and "B" represents a slope, "g" and "B" are related to setting condition of the exposure equipment; that is, the product of "g" and "B" is a ration of the exposure adjustment value given for equipment setting to the actual exposure error. Therefore, the actual exposure error of host product last processed is combined with "g" and "B" to form an actual adjustment value difference considered in the PFBS parameter calculation between each lot operation.

However, because amount of host product operated is large, secondary product is affected greatly by host product. For secondary product, referring to FIG. 2, step 200 for choosing a suitable PFBS start value is also performed first. The PFBS start value suited to the secondary product is chosen, and formula (2) is used to calculate the PFBS parameter for secondary product. Formula (2) is given as:

$$PPs_{mis,N} = PPs_{host,cur} + \text{offset}_{mis,N}$$ formula (2)

Where "$PPs_{mis,N}$" in formula (2) is the PFBS parameter of the "N" lot secondary product exposed.

Following Step 200, Step 240 for providing a stardard point data of secondary product is then performed, and step 250 for providing a compensation difference data of secondary product is performed. The standard point of secondary product is "$PPs_{host,Cur}$" in formula (2). The definition of "$PPs_{host,cur}$" is different from the stardard point of host product, and the "PPs" is the PFBS parameter evaluated of host product in the most recent operation, not the PFBS parameter evaluated of secondary product last processed.

The compensation difference of secondary product is included in "offset$_{mis>}$N" in formula (2). In addition to actual exposure error of secondary product, the difference between host product and secondary product is also included in the "offset$_{mis,N}$". Therefore, the "offset$_{mis,N}$" is composed of two parts and shown as formula (3):

$$\text{offset}_{mis,N} = \text{offset}_{mis,N} - g*B*(PPm_{mis,N-1} - \text{Target})$$ formula (3)

One part of the "offset$_{mis,N}$ is "offsetmis,$_{N-1}$" in formula (3), and the "offset$_{mis,N-1}$" represents the difference between the "N-1" lot secondary product exposed and host product; that is, the difference in the PFBS parameter evaluated between secondary product last processed and host product in most recent operation (i.e., "$PPs_{host,cur}$"). As secondary product is processed in turn, the "offset$_{mis,N-1}$" value varies with the PFBS parameter variation of secondary product. By definition, when processing host product, offset is set equal to zero.

Another part after the first minus sign "−" in formula (3) represents an actual adjustment value difference considered in the PFBS parameter calculation between each lot operation for secondary product. Like formula (1), "g" in formula (3) is a damping factor, and "B" represents a slope. "$PPm_{mis,N-1}$" in formula (3) is an actual measurement value of the "N-1" lot secondary product exposed, and the "Target" is an objective value predicted. The difference in value between the "$PPm_{mis,N-1}$" and "Target" represents the actual exposure error of secondary product last processed. Therefore, the actual exposure error of adjustment value difference considered in the PFBS calculation between each lot operation.

By the definition of the standard point and the compensation difference, the actual exposure error of secondary product and the influence of host product on exposure condition are included in formula (2), and the PFBS parameter calculation for secondary product is dependent on exposure variation of host product.

As shown in FIG. 2, after the standard point and the compensative difference are provided, step 260 for evaluating the PFBS parameter value is then preformed for host product or secondary product. Finally, the PFBS parameter evaluated is given to the exposure equipment as an adjustment value, and the exposure equipment adjusts exposure condition automatically.

In accordance with the present invention, and referring to FIG. 3, the PFBS parameter evaluation before each exposure operation secondary product is based on the PFBS parameter of host product. As shown, in FIG. 3, the solid line curve 310 and the solid line curve 330 represent the PFBS parameter variation of first-run and second-run for host product, respectively, while the dashed line curve 320 and the dashed line curve 340 represent the PFBS parameter variation of first-run and second-run for secondary product, respectively.

BACKGROUND OF THE INVENTION

Photolithography process is very important for pattern definition in semiconductor technologies, in which the accuracy and stability of photolithography directly affect product quality. In particular, with the device size being decreased, the challenge to photolithography is increased, and slight variation in pattern exposed leads to a great error and effect. In addition, device manufacture usually involves a stack of multiple films, and therefore aligning the under-layer pattern is performed before exposure for each film pattern. Thus, the critical dimension (CD) loss of patterns or pattern deviation hinders alignment accuracy, and results in product defects and the rework rate of photolithography being raised.

Many factors, such as product type, equipment condition and human factors, have obvious influence on photolithography process, and therefore accurate exposure conditions have to be adjusted constantly in response to actual variation. At present, an automatic compensation adjustment method is generally used to deal with the CD loss and pattern deviation problems for exposure variation each time.

The automatic compensation adjustment method utilizes the difference between a real measurement value and a predictive value recorded for each run of exposure process, and combines a last exposure adjustment value with exposure variation to calculate another exposure adjustment value for a next run of exposure process. The exposure adjustment value calculated is used to offset exposure variation automatically before each exposure operation is performed.

The automatic compensation adjustment method used popularly is called "Photo Feed-Back System" (PFBS), and the exposure adjustment value calculated is the PFBS parameter. The PFBS is just a single formula, and has only one PFBS parameter for all kinds of products. The real measurement value and the PFBS parameter operated are used as databases to evaluate the next PFBS parameter before the next run of exposure operation is performed.

But the PFBS aforementioned is only suitable for use with one type of product, and the database includes different types of products if miscellaneous products exposed are alternately added in operation. The exposure condition is changeable in practice and is affected by differences in multiple products; there is thus an error in the exposure adjustment value evaluated if the preceding database is directly used without consideration for product differences.

In addition to a host product, various minor products are sometimes added alternately to general operations, but exposure error adjustment uses the same PFBS for host product and minor products separately. Referring to FIG. 1, exposure adjustment calculation for host product and minor products is performed separately. The Y-axis in FIG. 1 shows the PFBS parameter, and the X-axis shows recorded exposure date. Various minor products are considered miscellaneous products. The dashed line shows variation in the PFBS parameter of miscellaneous products, and the solid line shows variation in the PFBS parameter of the host product.

The same PFBS calculation formula is used for host product and miscellaneous product separately, and the PFBS of host product and the PFBS of miscellaneous product are independent.

As shown in FIG. 1, the solid line curve 110 and the solid line curve 130 represent the PFBS parameter variation of first-run and second-run for host product respectively. The dashed curve 120 and the dashed curve 140 represent the PFBS parameter variation of first-run and second-run for miscellaneous products, respectively.

The end-point PFBS parameter of the first-run for host product (the end-point of the solid line curve 110) is chosen as the starting PFBS parameter of the second-run for host product (the starting point of the solid line curve 130) directly; that is, the starting point of the solid line curve 130 is the same as the end-point of the solid line curve 110. Similarly, the starting PFBS parameter of the second-run for miscellaneous product (the starting point of the dashed line curve 140) is also chosen as the end-point PFBS parameter of the first-run for miscellaneous product (the end-point of the dashed line curve 120) directly; that is, the starting point of the dashed line curve 140 is the same as the end-point of the dashed line curve 120.

The PFBS parameter evaluated has an error if the PFBS calculation only considers exposure condition of the same product last processed as the database without considering exposure conditions of other different products inserted.

Actually, there are various multiple products in operation, and the variation of exposure deviation and CD loss are affected by different products, and therefore operation for host product and minor miscellaneous product cannot be considered independent respectively. The PFBS used nowadays still experiences inaccuracy in exposure error adjustment in photolithography for multiple products.

SUMMARY OF THE INVENTION

Objectives of the present invention are to provide an automatic adjusting method for exposure error adjustment in photolithography, and improve the PFBS used for multiple products operation. The adjustment value for miscellaneous product is designed to be related to host product, and the influence of host product on miscellaneous product in practical exposure process is considered to make the PFBS adjustment more precise, and thus the yield and quality of product are improved. Further, the rework rate in photolithography is decreased greatly.

According to objectives aforementioned, the present invention discloses a method of exposure error adjustment automatically in photolithography. First, the PFBS used for host product or miscellaneous product is chosen, and a standard point and a compensation difference are then provided to evaluate the PFBS parameter of each exposure operation. The PFBS parameter evaluated is set to be a compensative adjustment value for the exposure equipment, and the exposure equipment is thus able to adjust exposure error automatically to maintain the exposure accuracy for each operation.

In addition to distinguish different PFBS used for host product and miscellaneous product, the PFBS of host product must be related to that of miscellaneous product to add the influence of the host product on the miscellaneous product in the exposure adjustment calculation.

According to one preferred embodiment of this invention, the PFBS suited to the host product or miscellaneous product is chosen, and the PFBS parameter for the host product or miscellaneous product is then calculated to be an adjustment value for exposure equipment adjusting error automatically.

The PFBS has different calculation formulae for host product and miscellaneous product, respectively. The suitable PFBS is chosen by product type, and a standard point and a compensation difference are then given to calculate the PFBS parameter. The difference in the PFBS between host product and miscellaneous product is the definition of the standard point and the compensation difference. For the host product, the standard point is the PFBS parameter of the host product last processed, and the compensation difference is an actual exposure error of host product last processed.

For miscellaneous product, the standard point is the PFBS parameter of host product in a nearest operation, and the compensation difference comprises two parts. One part of the compensation difference is the difference between miscellaneous product and host product, and another is an actual exposure error of miscellaneous product last processed. The difference between miscellaneous product and host product is the difference in the PFBS parameter value between miscellaneous product last processed and nearest host product operation.

This invention can be employed for exposure deviation and CD loss adjustment. For exposure deviation adjustment, the PFBS parameter and actual exposure error are the adjustment deviation and error deviation measured respectively. Besides, for CD loss adjustment, the PFBS parameter and actual error are the adjustment CD and CD loss measured respectively.

With the application of the present invention, exposure error for multiple products can be adjusted more accurately to prevent error from spreading and maintain the product yield.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

The present invention is a method of exposure error adjustment automatically in photolithography, and drawbacks in the PFBS used nowadays are improved to enhance accuracy of exposure and promote product operation.

The invention utilizes the PFBS parameter calculation formula to evaluate an adjusted value of exposure, the PFBS parameter calculation for minor secondary product is modified to link the primary or host product exposure and the adjustment value calculation is thus modified for the real exposure condition. The reference database of minor secondary product for adjustment value calculation is designed to be related to the adjustment value of the host product, and therefore exposure for minor secondary products is modified depending on exposure variation of host product.

Embodiment

The host product is defined as the primary product for which the manufacturing process, equipment, and software have been set-up and configured to produce, in a multiple products manufacturing processes. Occasionally, various minor products are scheduled into operations. The various minor products are termed the secondary products, and amount of secondary product processed is much smaller than host product.

Figure 2:
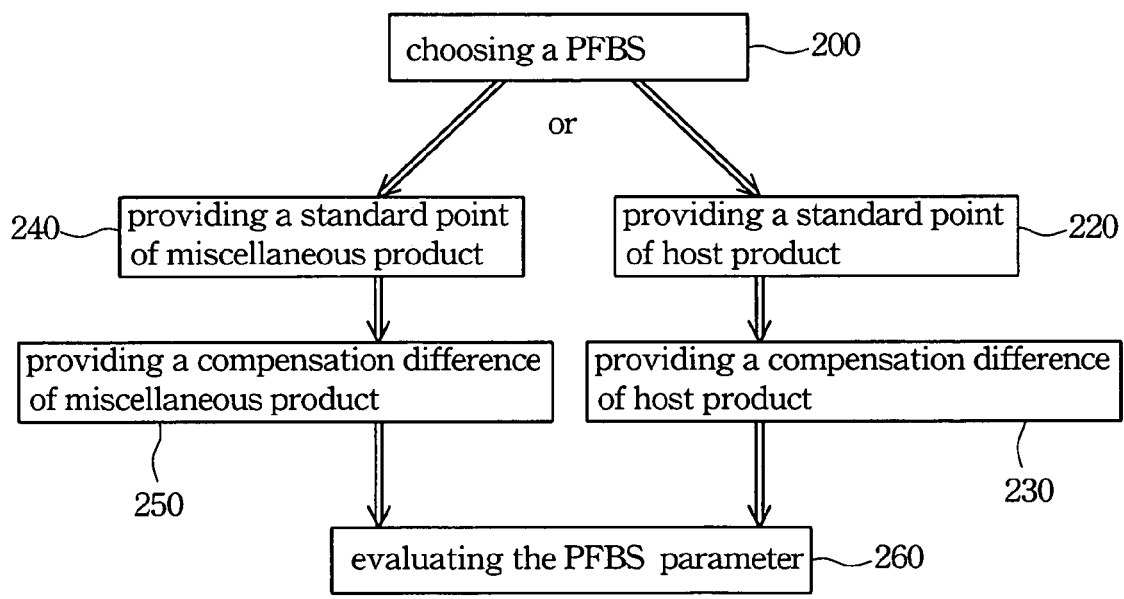
FIG. 2 is a flow diagram showing exposure error adjustment for multiple products in accordance with the present invention.

Because of the small amount of secondary product processed compared to the amount of host product. the influence of the secondary product on whole product operation is limited, and therefore the host product is not noticeably affected by secondary product. Thus, the host product utilizes formula (1) for PFBS parameter calculation to evaluate the PFBS parameter as exposure adjustment value directly. Referring to FIG. 2, a step 200 for choosing a suitable PFBS start value is performed first. Once a PFBS start value suited to the host product is chosen, formula (1) is used to calculate the PFBS parameter for the host product. Formula (1) is given as:

$$PPs_{host,N} = PPs_{host,N-1} - g*B*(PPm_{host,N-1} - \text{Target})\} \qquad \text{formula (1)}$$

Where "$PPs_{host,N}$" in formula (1) is the PFBS parameter of the "N" lot host product exposed.

Following Step 200, Step 220 for providing a standard point data of host product is then performed, and step 230 for providing a compensation difference data of host product is also performed. The standard point of host product is "$PPs_{host,N-1}$" in formula (1), and "$PPs_{host,N-1}$" is the PFBS parameter evaluated for the "N–1" lot host product exposed. That is, the "$PPs_{host,N-1}$" is the PFBS parameter evaluated of host product last processed.

The compensation difference of host product is the section after the minus sign "–" in formula (1), where "$PPm_{host,N-1}$" represents an actual measurement value of the "N–1" lot host product exposed, and the "Target" is an objective value predicted. The difference in value between "$PPm_{host,N-1}$" and "Target" represents an actual exposure error of host product last processed.

Further, "g" in formula (1) is a damping factor, and "B" represents a slope, "g" and "B" are related to setting condition of the exposure equipment; that is, the product of "g" and "B" is a ratio of the exposure adjustment value given for equipment setting to the actual exposure error. Therefore, the actual exposure error of host product last processed is combined with "g" and "B" to form an actual adjustment value difference considered in the PFBS parameter calculation between each lot operation.

However, because amount of host product operated is large, secondary product is affected greatly by host product. For secondary product, referring to FIG. 2, step 200 for choosing a suitable PFBS start value is also performed first. The PFBS start value suited to the secondary product is chosen, and formula (2) is used to calculate the PFBS parameter for secondary product. Formula (2) is given as:

$$PPs_{mis,N} = PPs_{host,cur} + \text{offset}_{mis,N} \qquad \text{formula (2)}$$

Where "$PPs_{mis,N}$" in formula (2) is the PFBS parameter of the "N" lot secondary product exposed.

Following Step 200, Step 240 for providing a standard point data of secondary product is then performed, and step 250 for providing a compensation difference data of secondary product is performed. The standard point of secondary product is "$PPs_{host,Cur}$" in formula (2). The definition of "$PPs_{host,cur}$" is different from the standard point of host product, and the "$PPs_{host,cur}$" is the PFBS parameter evaluated of host product in the most recent operation, not the PFBS parameter evaluated of secondary product last processed.

The compensation difference of secondary product is included in "offset$_{mis,N}$" in formula (2). In addition to actual exposure error of secondary product, the difference between host product and secondary product is also included in the "offset$_{mis,N}$". Therefore, the "offset$_{mis,N}$" is composed of two parts and shown as formula (3):

$$\text{offset}_{mis,N} = \text{offset}_{mis,N-1} - g*B*(PPm_{mis,N-1} - \text{Target}) \quad \text{formula (3)}$$

One part of the "offset$_{mis,N}$" is "offset$_{mis,N-1}$" in formula (3), and the "offset$_{mis,N-1}$" represents the difference between the "N-1" lot secondary product exposed and host product; that is, the difference in the PFBS parameter evaluated between secondary product last processed and host product in most recent operation (i.e., "PPs$_{host,cur}$"). As secondary product is processed in turn, the "offset$_{mis,N-1}$" value varies with the PFBS parameter variation of secondary product. By definition, when processing host product, offset is set equal to zero.

Another part after the first minus sign "−" in formula (3) represents an actual adjustment value difference considered in the PFBS parameter calculation between each lot operation for secondary product. Like formula (1), "g" in formula (3) is a damping factor, and "B" represents a slope. "PPm$_{mis,N-1}$" in formula (3) is an actual measurement value of the "N-1" lot secondary product exposed, and the "Target" is an objective value predicted. The difference in value between the "PPm$_{mis,N-1}$" and "Target" represents the actual exposure error of secondary product last processed. Therefore, the actual exposure error of secondary product last processed is combined with "g" and "B" to form the actual adjustment value difference considered in the PFBS parameter calculation between each lot operation.

By the definition of the standard point and the compensation difference, the actual exposure error of secondary product and the influence of host product on exposure condition are included in formula (2), and the PFBS parameter calculation for secondary product is dependent on exposure variation of host product.

As shown in FIG. 2, after the standard point and the compensative difference are provided, step 260 for evaluating the PFBS parameter value is then performed for host product or secondary product. Finally, the PFBS parameter evaluated is given to the exposure equipment as an adjustment value, and the exposure equipment adjusts exposure condition automatically.

Figure 3:
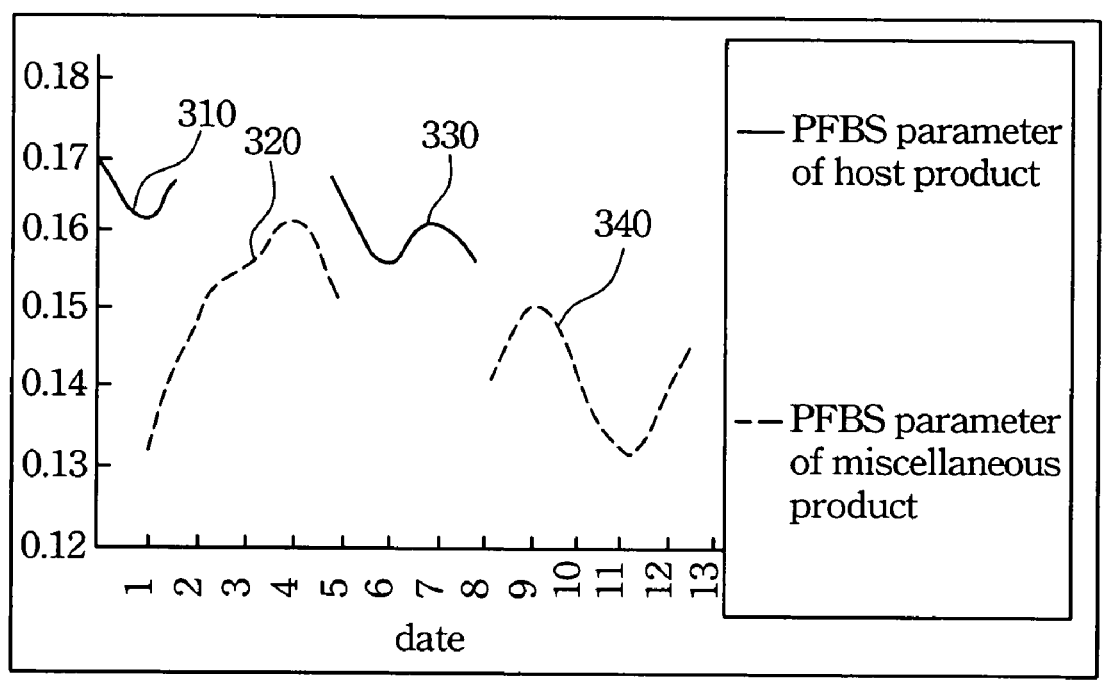
FIG. 3 is a relational diagram showing the PFBS parameter variation for multiple products operation in accordance with the present invention.

In accordance with the present invention, and referring to FIG. 3, the PFBS parameter evaluation before each exposure operation for secondary product is based on the PFBS parameter of host product. As shown in FIG. 3, the solid line curve 310 and the solid line curve 330 represent the PFBS parameter variation of first-run and second-run for host product, respectively, while the dashed line curve 320 and the dashed line curve 340 represent the PFBS parameter variation of first-run and second-run for secondary product, respectively.

DETAILED DESCRIPTION OF THE PREFERRED EMBODIMENTS

The present invention is a method of exposure error adjustment automatically in photolithography, and drawbacks in the PFBS used nowadays are improved to enhance accuracy of exposure and promote product operation.

The invention utilizes the PFBS parameter calculation formula to evaluate adjustment value of exposure, the PFBS parameter calculation for minor miscellaneous product is modified to link host product exposed, and adjustment value calculation is thus fit for real exposure condition. The reference database of minor miscellaneous product for adjustment value calculation is designed to be related to adjustment value of host product, and therefore exposure of minor miscellaneous products is modified depending on exposure variation of host product.

Embodiment

It is assumed that the host product is mainly processed in s multiple products manufacturing processes, and various minor products are added into operations alternately. The various minor products are generally called the miscellaneous products, and amount of miscellaneous product processed is much smaller than host product.

Because of the small amount of miscellaneous product processed, the influence of the miscellaneous product on whole product operation is limited, and therefore the host product is not apparently affected by miscellaneous product. Thus, the host product utilizes formula (1) for PFBS parameter calculation to evaluate the PFBS parameter as a exposure adjustment value directly. Referring to FIG. 2, a step 200 for choosing a suitable PFBS is performed first. The PFBS suited to the host product is chosen, and formula (1) is used to calculate the PFBS parameter for the host product. Formula (1) is given as:

$$PPs_{host,N} = PPs_{host,N-1} - g*B*(PPm_{host,N-1} - \text{Target}) \quad \text{formula (1)}$$

Where "PPs$_{host,N}$" in formula (1) is the PFBS parameter of the "N" lot host product exposed.

Step 220 for providing a standard point data of host product is then performed, and step 230 for providing a compensation difference data of host product is also performed. The standard point of host product is "PPs$_{host,N-1}$" in formula (1), and "PPs$_{host,N-1}$" is the PFBS parameter evaluated for the "N-1" lot host product exposed. That is, the "PPs$_{host,N-1}$" is the PFBS parameter evaluated of host product last processed.

The compensation difference of host product is the section after the minus sign "−" in formula (1), where "PPm$_{host,N-1}$" represents an actual measurement value of the "N-1" lot host product exposed, and the "Target" is an objective value predicted. The difference in value between "PPm$_{host,N-1}$" and "Target" represents an actual exposure error of host product last processed.

Further, "g" in formula (1) is a damping factor, and "B" represents a slope. "g" and "B" are related to setting condition of the exposure equipment; that is, the product of "g" and "B" is a ratio of the exposure adjustment value given for equipment setting to the actual exposure error. Therefore, the actual exposure error of host product last processed is combined with "g" and "B" to form an actual adjustment value difference considered in the PFBS parameter calculation between each lot operation.

However, because amount of host product operated is large, miscellaneous product is affected greatly by host product. For miscellaneous product, referring to FIG. 2, step 200 for choosing a suitable PFBS is also performed first. The PFBS suited to the miscellaneous product is chosen, and formula (2) is used to calculate the PFBS parameter for miscellaneous product. Formula (2) is given as:

$$PPs_{mis,N} = PPs_{host,cur} + \text{offset}_{mis,N} \quad \text{formula (2)}$$

Where "PPs$_{mis,N}$" in formula (2) is the PFBS parameter of the "N" lot miscellaneous product exposed.

Step 240 for providing a standard point data of miscellaneous product is then performed, and step 250 for providing a compensation difference data of miscellaneous product is performed. The standard point of miscellaneous product is "$PPs_{host,cur}$" in formula (2). The definition of "$PPs_{host,cur}$" is different from the standard point of host product, and the "$PPs_{host,cur}$" is the PFBS parameter evaluated of host product in nearest current operation, not the PFBS parameter evaluated of miscellaneous product last processed.

The compensation difference of miscellaneous product is "$offset_{mis,N}$" in formula (2). In addition to actual exposure error of miscellaneous product, the difference between host product and miscellaneous product is also included in the "$offset_{mis,N}$". Therefore, the "$offset_{mis,N}$" is composed of two parts and shown as formula (3):

$$offset_{mis,N} = offset_{mis,N-1} - g*B*(PPm_{mis,N-1} - Target) \quad \text{formula (3)}$$

One part of the "$offset_{mis,N}$" is "$offset_{mis,N-1}$" in formula (3), and the "$offset_{mis,N-1}$" represents, the difference between the "N-1" lot miscellaneous product exposed and host product; that is, the difference in the PFBS parameter evaluated between miscellaneous product last processed and host product in nearest operation (i.e., "$PPs_{host,cur}$"). As miscellaneous product is processed in turn, the "$offset_{mis,N-1}$" value varies with the PFBS parameter variation of miscellaneous product.

Another part after the minus sign "-" in formula (3) represents an actual adjustment value difference considered in the PFBS parameter calculation between each lot operation for miscellaneous product. Like formula (1), "g" in formula (3) is a damping factor, and "B" represents a slope. "$PPm_{mis,N-1}$" in formula (3) is an actual measurement value of the "N-1" lot miscellaneous product exposed, and the "Target" is an objective value predicted. The difference in value between the "$PPm_{mis,N-1}$" and "Target" represents the actual exposure error of miscellaneous product last processed. Therefore, the actual exposure error of miscellaneous product last processed is combined with "g" and "B" to form the actual adjustment value difference considered in the PFBS parameter calculation between each lot operation.

By the definition of the standard point and the compensation difference, the actual exposure error of miscellaneous product and the influence of host product on exposure condition are included in formula (2), and the PFBS parameter calculation for miscellaneous product is dependent on exposure variation of host product.

As shown in FIG. 2, after the standard point and the compensative difference are provided, step 260 for evaluating the PFBS parameter value is then performed for host product or miscellaneous product. Finally, the PFBS parameter evaluated is given to the exposure equipment as an adjustment value, and the exposure equipment adjusts exposure condition automatically.

In accordance with the present invention, and referring to FIG. 3, the PFBS parameter evaluation before each exposure operation for miscellaneous product is based on the PFBS parameter of host product. As shown in FIG. 3, the solid line curve 310 and the solid line curve 330 represent the PFBS parameter variation of first-run and second-run for host product, respectively, while the dashed line curve 320 and the dashed line curve 340 represent the PFBS parameter variation of first-run and second-run for miscellaneous product, respectively.

The end-point PFBS parameter value of the first-run for miscellaneous product (i.e., the end-point of the dashed line curve 320) is not chosen as the starting PFBS parameter value of the second-run for miscellaneous product (i.e., the starting point of the dashed line curve 340) directly; that is, the starting point of the dashed line curve 340 is different from the end-point of the dashed line curve 320. The end-point PFBS parameter of the second-run for host product (i.e., the end-point of the solid line curve 330) and the PFBS parameter difference between miscellaneous product last processed and host product in nearest operation (i.e., the difference in value between the end-point of the dashed line curve 320 and the starting point of the solid line curve 330) are all included in the PFBS parameter calculation of second-run for miscellaneous product.

Figure 1:
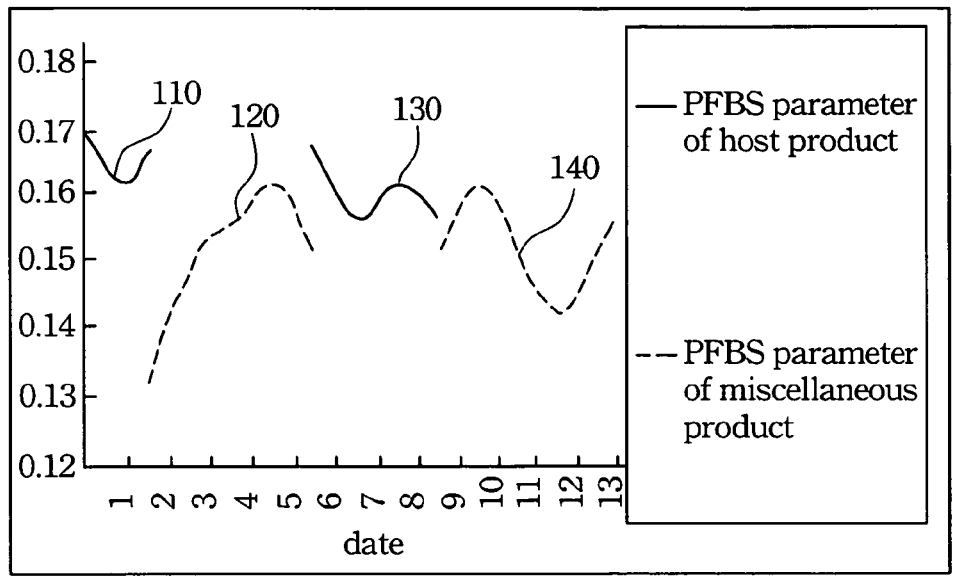
FIG. 1 is a relational diagram showing the PFBS parameter variation for multiple products operation in prior art.

The PFBS parameter evaluation of miscellaneous product is related to the PFBS parameter variation of host product, and when compared with FIG. 1, exposure error adjustment of this invention for miscellaneous product is more precise.

According to this invention, the influence of host product on miscellaneous product is not neglected in exposure operation for multiple products, an exposure error can be avoided effectively, and the rework rate for re-aligning or re-adjusting is therefore decreased. The exposure adjustment value evaluated is used to adjust exposure variation automatically before the exposure process to prevent exposure error enlargement, and there is no need to check and adjust equipment condition before each multiple product is exposed.

The exposure error aforementioned comprises two types of exposure deviation and CD loss, and the present invention can be used for adjusting exposure deviation and CD loss.

With the application of the present invention for adjusting exposure deviation, the PFBS parameter and the actual exposure error are the adjustment deviation and mistaken deviation measured, respectively. Further, for CD loss adjustment, the PFBS parameter and the actual exposure error are the adjustment CD and CD loss measured respectively.

While the present invention has been disclosed with reference to the preferred embodiment of this invention, it should not be considered as limited thereby. Various possible modifications and alterations by one skilled in the art can be included within the spirit and scope of the present invention, and the scope of the invention is determined by the claims that follow.

What is claimed is:

1. A method of exposure error adjustment in photolithography for multiple products, comprising the steps of:
   determining if the product to be processed is a secondary product;
   choosing a photo feedback system (PFBS) start value;
   providing a standard point;
   providing an offset difference;
   evaluating a compensation difference; and
   calculating a photo feedback system (PFBS) parameter to evaluate an adjustment value of each operation for automatic adjustment.

2. The method of claim 1, wherein the step of choosing the photo feedback system (PFBS) start value is a decision regarding the photo feedback system (PFBS) start value suited to the product to be processed.

3. The method of claim 2, wherein the standard point for the host product is the photo feedback system (PFBS) parameter of the host product last processed.

4. The method of claim 2, wherein the compensation difference for the host product is an actual exposure error of the host product last processed.

5. The method of claim 2, wherein the standard point for the secondary product is the photo feedback system (PFBS) parameter of the host product in a most recent operation.

6. The method of claim 2, wherein the compensation difference for the secondary product comprises an offset difference between the host product and the secondary product and the actual error of the secondary product last processed.

7. The method of claim 6, wherein the offset difference between the host product and the secondary product is a value difference in the photo feedback system (PFBS) parameter between the secondary product last processed and the host product in the most recent operation.

8. A method of exposure deviation error adjustment for multiple products, comprising the steps of:
   determining if the product to be processed is a secondary product;
   choosing a photo feedback system (PFBS) start value suited to the product to be processed;
   providing a photo feed-back system (PFBS) parameter evaluated from the host product in a most recent operation as a standard point;
   providing an offset difference;
   evaluating a compensation difference; and
   calculating the photo feedback system (PFBS) parameter to evaluate an adjustment deviation of each exposure operation for automatic adjustment.

9. The method of claim 8, wherein the photo feedback system (PFBS) parameter is the adjustment deviation.

10. The method of claim 8, wherein the compensation difference for the host product is an actual deviation error of the host product last processed.

11. The method of claim 8, wherein the compensation difference for the secondary product comprises an offset difference between the host product and the secondary product and the actual deviation error of the secondary product last processed.

12. The method of claim 11, wherein the offset difference between the host product and the secondary product is a value difference in the photo feedback system (PFBS) parameter between the secondary product last processed and the host product in the most recent operation.

13. A method of exposure critical dimension (CD) loss adjustment for multi-product, comprising the steps of:
   determining if the product to be processed is a secondary product;
   choosing a photo feedback system (PFBS) start value suited to the product to be processed;
   providing a photo feed-back system (PFBS) parameter evaluated from the host product in a nearest operation as a standard point;
   providing an offset difference;
   evaluating a compensation difference; and
   calculating the photo feedback system (PFBS) parameter to evaluate an adjustment critical dimension (CD) of each exposure operation for automatic adjustment.

14. The method of claim 13, wherein the photo feedback system (PFBS) parameter is the adjustment critical dimension (CD).

15. The method of claim 13, wherein the compensation difference for the host product is an actual critical dimension (CD) loss of the host product last processed.

16. The method of claim 13, wherein the compensation difference for the secondary product comprises an offset difference between the host product and the secondary product and the actual critical dimension (CD) loss of the secondary product last processed.

17. The method of claim 16, wherein the offset difference between the host product and the secondary product is a value difference in the photo feedback system (PFBS) parameter between the secondary product last processed and the host product in the most recent operation.

* * * * *